Oct. 27, 1959 R. L. PRITCHARD 2,910,653

JUNCTION TRANSISTORS AND CIRCUITS THEREFOR

Filed Oct. 17, 1956

Inventor:
Robert L. Pritchard, by Paul A. Frank
His Attorney.

United States Patent Office 2,910,653

Patented Oct. 27, 1959

2,910,653

JUNCTION TRANSISTORS AND CIRCUITS THEREFOR

Robert L. Pritchard, Schenectady, N.Y., assignor to General Electric Company, a corporation of New York Application October 17, 1956, Serial No. 616,435

9 Claims. (Cl. 331—108)

Figure 1:
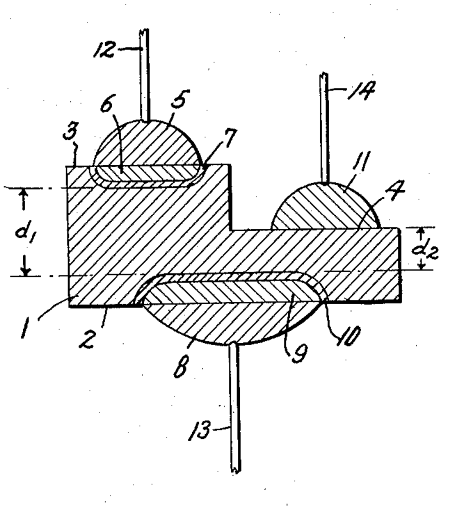

The present invention relates to transistor devices and oscillator circuits therefor. More particularly the invention relates to junction transistors which exhibit a negative resistance characteristic, and to low frequency oscillator circuits therefor.

According to well accepted oscillator theory, an electronic oscillator must include a signal translating device having a negative resistance characteristic, or, alternatively, a regenerative feedback path must be provided between the output and the input circuits of the signal translating device utilized.

Point contact semiconductor transistors may readily be made to supply a negative resistance characteristic. This is because the input resistance of a point contact transistor is composed of two components, the first of which is an inherently negative resistance, due to the high current amplification characteristic ($\alpha$) of the point contact transistor. The second component comprises an inherently positive resistance due to the resistance of the point contact, and the resistance of the bulk semiconductor material of which the device is constructed. Both of the above components of the input resistance of point contact transistors may be varied by varying the collector and the emitter voltages. By so doing, a negative resistance characteristic may readily be obtained, and thus the point contact type transistor may readily serve as a component of a negative resistance transistor oscillator circuit.

P–N junction transistors have proven to be quite superior to point contact transistors for a number of reasons, among which are their relatively low noise figure, their higher power handling capacity, and ease of operation with small power consumption. For these, and other reasons, it is desirable that transistor circuit components be junction-type rather than point contact type. Whereas, point contact transistors have an inherent negative resistance characteristic, due to their high amplification factors, and readily serve as components for transistor oscillator circuits, the P–N junction transistor has a current amplification factor which is generally less than unity. Because of this lack of current amplification, junction transistors are generally stable at low frequencies and do not ordinarily present negative resistance characteristics. For this reason, junction transistor oscillator circuits, operated at low frequencies, have heretofore included external regenerative feedback circuits, making such oscillator circuits complex.

Accordingly, an object of this invention is to provide a low or audio frequency negative resistance junction transistor oscillator circuit.

A further object of the invention is to provide a low frequency junction transistor oscillator which does not require an external feedback circuit path.

Another object of the invention is to provide low frequency junction transistor oscillator circuits of ultimate simplicity.

Still another object of the invention is to provide junction transistors which exhibit negative resistance characteristics at low frequencies.

Briefly stated, in accord with a broad aspect of the invention a low or audio frequency junction transistor oscillator circuit is provided by utilizing a junction transistor in which the base-to-collector distance is less than the collector-to-emitter distance, applying appropriate operating voltages thereto, and constructing an oscillator circuit utilizing circuit parameters which fix the frequency of oscillation in the audio range, less than 20 kilocycles per second. I have found that when such a junction transistor is operated with emitter and base short circuited to alternating current, the device exhibits a negative resistance at low frequencies, and low or audio frequency alternating current signals may be generated thereby without the use of external positive feedback circuit elements.

Figure 2:
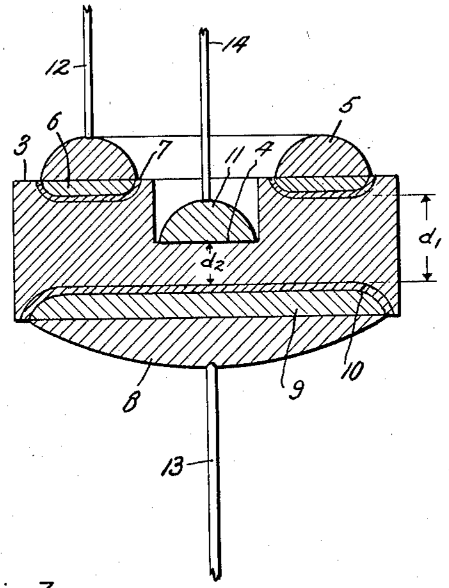
Figure 3:
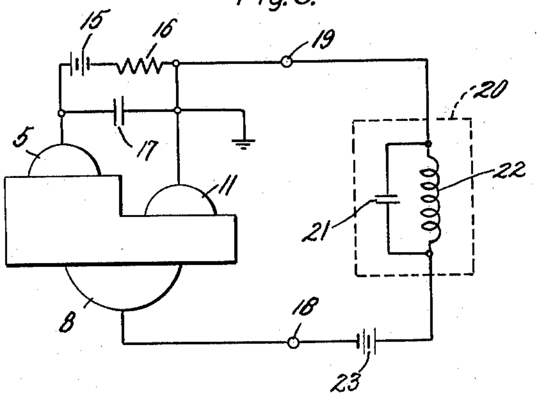

The novel features believed characteristic of the invention are set forth in the appended claims. The invention itself, however, together with further objects and advantages thereof, may best be understood by reference to the following description taken in connection with the attached drawing in which Figure 1 illustrates a junction transistor constructed in accord with one feature of the invention, Figure 2 illustrates an alternative embodiment of the device of Figure 1, and Figure 3 illustrates an oscillator utilizing the device of Figure 1 and constructed in accord with another feature of the invention.

In Figure 1 a junction transistor constructed in accord with the invention includes a thin wafer 1 of monocrystalline semiconductive material as, for example, germanium or silicon having a first substantially planar surface 2 on one side thereof and upon the opposite side thereof a plural stepped surface comprising surface portions 3 and 4. As will be noted from the diagram the distance from surface 2 to surface portion 4 is less than the distance from surface 2 to surface portion 3. Wafer 1 may conveniently be formed from a rectangular wafer of N-type germanium by grinding or etching a portion of one major surface thereof away to form recessed surface portion 4 thereupon. A junction transistor in accord with the invention is constructed from wafer 1 by forming rectifying contact 5 therewith by placing a quantity of an acceptor activator material of group III of the periodic table as, for example, indium in contact with surface portion 3 and heating the wafer and the indium to a temperature above the melting point of the indium but below the melting point of the germanium, so that the indium alloys with the germanium forming a region 6 of P-type conductivity germanium immediately under contact 5, and a fused P–N junction 7 at the interface between P-type region 6 and the main body 1 of N-type semiconductor wafer. A second rectifying contact 8 is made to the opposite, substantially planar surface 2 of N-type germanium wafer 1 by fusing or alloying a quantity of acceptor activator material as, for example indium, thereto in like manner as was done with contact 5 to form a P-type region 9 thereunder and a second P–N junction 10 at the interface between region 9 and main body of wafer 1. An ohmic or non-rectifying contact 11 is made to the recessed surface portion 4 of germanium wafer 1 by fusing or alloying thereto a quantity of an electron supplying material as, for example, tin or an alloy of a material such as tin and a donor activator impurity from group V of the periodic table as, for example, arsenic or antimony thereto to form an ohmic or non-rectifying contact. Appropriate lead-wires 12, 13 and 14 are inserted within and connected to contacts 5, 8 and 11, respectively, either during the fusion of these contacts to the germanium wafer, or subsequent thereto. Conveniently, contact 5 comprises an emitter contact or electrode; contact 8 comprises a collector contact or electrode; and contact 11 comprises a base contact or electrode for the transistor. While the structure of the transistor of Figure 1 has been described with respect to the P–N–P configuration, it will be appreciated that this structure may also be made in the N–P–N configuration in which case semiconductor wafer 1 originally comprises P-type germanium, rectifying contacts 5 and 8 comprise donor activator impurities and non-rectifying contact 11 comprises either a neutral material such as tin or an alloy of such a material with an acceptor activator material such as indium. Likewise silicon may be utilized rather than germanium.

The structure as illustrated in Figure 1 is particularly useful because the base contact to collector contact distance through the base region of the transistor (denominated as $d_2$) is less than the emitter-to-collector distance through the base region (denominated as $d_1$). This condition is essential in the operation of the circuits of the invention and will be described with particularity with respect to the operation of this circuit of Figure 3.

For optimum results it is preferred that $d_2$ have a value no greater than 50% of the value of $d_1$. Under these conditions, the device invariably exhibits a negative resistance characteristic suitable for incorporation in a negative resistance low frequency oscillator circuit. Other considerations must also be satisfied. Thus, while in the construction of devices in accord with the invention, the ratio of $d_1/d_2$ may be much greater than 2, for the attainment of reasonable $\alpha$, $d_1$ should not be greater than 0.003″. Additionally, to avoid localized breakdown of collector junction 10, in the reverse direction, $d_2$ should be no smaller than 0.0005″. Thus it is preferred that the ratio of $d_1/d_2$ be within the range of 2 to 6.

In Figure 2 of the drawing there is illustrated an alternative embodiment of the device of Figure 1. In this embodiment the semiconductor wafer 1 may be a disk, and the indented surface portion 4 thereof may be formed by etching or grinding a recess in one major surface 3 thereof. Rectifying contacts 5 and 8 are made thereto in the manner similar to the formation of device of Figure 1, the substantial modification being that emitter contact 5 is made in the form of an annulus, contacting annular surface 3. The device of Figure 2 possesses the same necessary characteristics of the device of Figure 1, namely, that the base contact-to-collector contact distance through the base region 1 be less than the emitter contact-to-collector contact distance. Preferably the ratio of $d_1/d_2$ should be from 2 to 6. The device of Figure 2 has the advantage over the device of Figure 1, of greater emitter area, thus facilitating its operation at higher power levels.

In Figure 3 of the drawing the device of Figure 1 is connected in circuit configuration in accord with the invention to provide a negative resistance low frequency oscillator. In Figure 3 the emitter-base circuit comprises a source of unidirectional potential 15 and a resistance represented by resistor 16. Since in the illustrated embodiment, the junction transistor is a P–N–P transistor, battery 15 is connected with the positive terminal thereof connected to emitter electrode 5 and the negative terminal thereof is connected through resistance 16 to base electrode 11. Emitter junction 7 is thus biased in the forward or easy flow direction. An alternating current bypass capacitor 17 is connected directly between emitter and base electrodes, short-circuiting the two electrodes for alternating currents. The value of by-pass capacitor 17 is not critical. Since the oscillator circuit of the invention is provided to operate at frequencies in the audio range, or from 10 to 20,000 cycles per second, capacitor 17 may conveniently be from 1 to 1000 microfarads, and is chosen to offer substantially no alternating current impedance at the operating frequency. Its exact value for any particular operating frequency, may be readily determined by those skilled in the art according to well known considerations. The output conductance of the transistor appears between terminals 18 and 19, or between the collector and base electrodes. In order that alternating current oscillations be obtained, a suitable resonant circuit 20 is connected between terminals 18 and 19. Resonant circuit 20 may conveniently comprise a parallel-connected capacitance 21 and inductance 22, the values of which are not critical. These values are chosen, in order that the frequency of oscillation, which is determined thereby, falls within the audio range, or approximately 10 to 20,000 cycles per second. A second battery 23 is connected in the base-collector circuit to bias collector junction 10 in the reverse direction.

In the junction transistor illustrated in Figure 1, emitter junction 7 and collector junction 10 may be considered as space charge barrier layers having a finite width. It has been found that when the collector voltage, that is, the instantaneous value of the voltage appearing between collector and base electrodes, increases in the direction of the unidirectional bias applied thereto, the net effect upon the transistor is that of effectively widening the collector space charge layer comprising the collector junction 10. This widening of the collector space charge layer or barrier has several effects upon the transistor. First, it decreases the width of the base region between the collector and base electrodes. Since the base current within the transistor flows from the emitter to the base and consequently flows transversely along the distance between the collector and the base contacts, this decreasing of the distance between the collector and base contacts effectively increases the resistance of the region. Thus, in effect, increasing collector voltage causes a modulation of base resistance by collector voltage. This increasing collector voltage, may thus result in a decrease of the emitter-base voltage and thus results in negative feedback. This effect tends to give the resistance characteristic of the transistor, viewed at the base-collector output terminals, a negative resistance characteristic.

Another effect which is caused by space charge layer widening at the collector due to the increase of the width of the collector space charge region is that the distance between the collector junction and the emitter junction is also decreased. This tends to increase the alpha of the transistor and results in effectively increasing the positive resistance characteristic of the transistor. Because of the configuration of the transistor of the invention illustrated in Figures 1 and 2, wherein the base contact is closer to the collector contact than is the emitter contact, the base-to-collector distance is decreased proportionally much more than is the emitter-to-collector distance. Due to the greater proportional decrease of the base-to-collector distance, the first mentioned effect, namely, the increasing of the negative resistance characteristic, predominates, and modulation of the base resistance by increasing collector voltage causes the transistor of the invention to illustrate a net negative resistance characteristic when viewed at the output terminals 18 and 19 thereof.

Accordingly when the junction transistor illustrated in Figures 1 and 2 of the drawing, having a smaller distance between collector and base electrodes than exist between emitter and collector electrodes is connected as illustrated in Figure 3, and the values of the capacitor and inductor in the output resonant circuit thereof are chosen to cause the operating frequency to be from 10 to 20,000 cycles per second, oscillations may be generated without the necessity of an external feedback circuit between the collector and the emitter circuits.

One such circuit as illustrated in Figure 3 utilizing a silicon P–N–P transistor operated with a collector voltage, $E_c$, of 4.5 volts and an emitter current, $I_e$, of 4 milliamperes, wherein inductance 21 had a value of 4 henries, capacitance 20 had a value of 120 micromicrofarads, and capacitance 17 had a value of 10 microfarads, oscillations at a frequency of 7800 cycles per second were obtained.

Although the invention has been described with respect to certain embodiments thereof it is apparent that many changes and modifications will immediately occur to those skilled in the art without departing from the true spirit of the invention. Accordingly, I intend by the appended claims to cover all such modifications as fall within the true spirit and scope of the foregoing disclosure.

What I claim as new and desire to secure by Letters Patent of the United States is:

1. A junction transistor comprising a body of semiconductive material of one conductivity type having opposed substantially parallel surfaces, a first rectifying electrode contacting one of said surfaces and forming therein a first P–N junction, a second rectifying electrode contacting another of said surfaces and forming therein a second P–N junction, a non-rectifying electrode contacting a third of said surfaces, the distance between said first P–N junction and said non-rectifying contact being less than the distance between said first P–N junction and said second P–N junction.

2. A P–N junction transistor comprising a body of semiconductive material of one conductivity type, a first electrode in rectifying contact with one surface of said wafer forming at the junction therewith a first P–N junction, a second rectifying electrode contacting an opposite surface of said wafer and inducing at the junction therewith a second P–N junction, and a third non-rectifying electrode contacting a second opposed substantially parallel surface of said wafer, the distance between said non-rectifying electrode and said first P–N junction being less than the distance between said first P–N junction and said second P–N junction by a factor of from 2 to 6.

3. A P–N junction transistor comprising a wafer of semiconductive material of one conductivity type having a first substantially planar surface and an opposite second surface having stepped substantially planar surface portions, a first rectifying electrode contacting said first surface and inducing therein a first P–N junction, a second rectifying electrode contacting a portion of said stepped surface and inducing thereunder a second P–N junction, a third non-rectifying electrode contacting a second portion of said stepped surface, the distance between said first rectifying electrode and said non-rectifying electrode being less than the distance between said first rectifying electrode and said second rectifying electrode.

4. A P–N junction transistor comprising a wafer of semiconductive material of one conductivity type having a first substantially planar surface, and a second substantially planar surface having a recessed portion therein, a first rectifying electrode contacting said first surface and inducing therein a first P–N junction, a second rectifying electrode contacting a portion of said second surface other than said recessed portion and inducing therein a second P–N junction, a non-rectifying electrode contacting the recessed portion of said second surface, the distance between said first P–N junction and said non-rectifying electrode being less than the distance between said first P–N junction and said second P–N junction by a factor of from 2 to 6.

5. A negative resistance junction transistor oscillator for generating low frequency oscillations comprising a junction transistor having oppositely disposed base, emitter, and collector electrodes, the distance through said transistor between said collector electrode and said base electrode being less than the distance through said transistor between said emitter electrode and said collector electrodes, means biasing said emitter in the forward direction, means biasing said collector in the reverse direction, by-pass means connecting said emitter and said base for alternating currents, and a resonant circuit resonant to a frequency from 10 to 20,000 c.p.s. connected between said collector electrode and said base electrode.

6. A negative resistance junction transistor oscillator for generating low frequency oscillations comprising a junction transistor having a base region of one conductivity type, a collector electrode contacting a first surface of said base region in rectifying contact therewith and forming therewith a collector P–N junction, an emitter electrode contacting second oppositely disposed surface of said base region in rectifying contact and inducing therein an emitter P–N junction, a base electrode contacting a third oppositely disposed surface of said base region in non-rectifying contact, the distance between said collector electrode and said base electrode being less than the distance between said emitter electrode and said collector electrode, means biasing said emitter junction in the forward direction, means biasing said collector junction in the reverse direction, means connecting said emitter and said base for alternating currents, and a resonant circuit resonant to a frequency from 10 to 20,000 c.p.s. connected between said collector and said base electrodes.

7. A negative resistance junction transistor oscillator for generating low frequency oscillations comprising a junction transistor having a base region of one conductivity type, a collector electrode in rectifying contact with a first surface of said region inducing therein a collector P–N junction, an emitter electrode in rectifying contact with a second oppositely disposed surface of said region inducing therein an emitter P–N junction, a base electrode in non-rectifying contact with a third oppositely disposed surface of said region, the distance between said collector junction and said base electrode being less than the distance between said collector junction and said emitter junction, means biasing said emitter junction in the forward direction, means biasing said collector junction in the reverse direction, a by-pass capacitor connecting said emitter electrode and said base electrode for alternating currents, and a resonant circuit having an inherent resonant frequency from 10 to 20,000 cycles per second connected between said collector electrode and said base electrode.

8. A junction transistor comprising a body of semiconductive material of one conductivity type having opposed substantially parallel surfaces, a first rectifying electrode contacting one of said surfaces to form a first P–N junction, a second rectifying electrode contacting another of said surfaces to form a second P–N junction, and a non-rectifying electrode contacting a third of said surface such that the distance between said first P–N junction and said non-rectifying electrode is no greater than one-half the distance between said first P–N junction and said second P–N junction.

9. A negative resistance junction transistor oscillator comprising the junction transistor as defined in claim 8 and means for biasing said first and second P–N junctions for operation, means for producing an alternating current short circuit between one of said P–N junctions and said non-rectifying electrode, and a resonant circuit resonant to a frequency between 10 and 20,000 c.p.s. connected between the other of said P–N junctions and said non-rectifying electrode.

References Cited in the file of this patent

UNITED STATES PATENTS

| | | |
|---|---|---|
| 2,769,906 | Kidd et al. | Nov. 6, 1956 |
| 2,777,065 | Pritchard | Jan. 8, 1957 |
| 2,796,563 | Ebers et al. | June 18, 1957 |
| 2,813,817 | Leverenz | Nov. 19, 1957 |

FOREIGN PATENTS

| | | |
|---|---|---|
| 203,059 | Australia | Jan. 6, 1955 |

OTHER REFERENCES

Article: "Poser Transistors," by Minn-Honeywell Transistor Division, March 21, 1955.